(12) United States Patent
Mochizuki

(10) Patent No.: US 10,197,878 B2
(45) Date of Patent: Feb. 5, 2019

(54) DISPLAY DEVICE

(71) Applicant: Japan Display Inc., Minato-ku (JP)

(72) Inventor: Kazuhide Mochizuki, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/611,196

(22) Filed: Jun. 1, 2017

(65) Prior Publication Data
US 2017/0351153 A1    Dec. 7, 2017

(30) Foreign Application Priority Data
Jun. 1, 2016   (JP) .................................. 2016-109979

(51) Int. Cl.
| | |
|---|---|
| *H01L 29/786* | (2006.01) |
| *G02F 1/136* | (2006.01) |
| *G02F 1/1362* | (2006.01) |
| *G02F 1/1335* | (2006.01) |
| *G02F 1/1343* | (2006.01) |
| *G02F 1/1368* | (2006.01) |

(52) U.S. Cl.
CPC ...... *G02F 1/136286* (2013.01); *G02F 1/1368* (2013.01); *G02F 1/133512* (2013.01); *G02F 1/134309* (2013.01); *G02F 1/134363* (2013.01); *G02F 1/136227* (2013.01); *G02F 2001/13606* (2013.01); *G02F 2001/13685* (2013.01); *G02F 2001/134345* (2013.01); *G02F 2001/134372* (2013.01); *G02F 2201/122* (2013.01); *G02F 2201/123* (2013.01); *H01L 29/78696* (2013.01)

(58) Field of Classification Search
CPC ......... G02F 1/136286; G02F 1/134363; G02F 1/133512; G02F 1/134309; G02F 1/1368; G02F 2201/123; G02F 2201/122; G02F 2001/134372; G02F 2001/13685; G02F 2001/13606; G02F 1/136227; G02F 1/133345; H01L 29/78696
See application file for complete search history.

(56) References Cited

U.S. PATENT DOCUMENTS

| | | | | |
|---|---|---|---|---|
| 2007/0171319 A1* | 7/2007 | Fujita | ................ | G02F 1/134309 349/43 |
| 2014/0198276 A1 | 7/2014 | Kesho et al. | | |

FOREIGN PATENT DOCUMENTS

JP       2014-137412       7/2014

\* cited by examiner

*Primary Examiner* — Caridad Everhart
(74) *Attorney, Agent, or Firm* — Oblon, McClelland, Maier & Neustadt, L.L.P.

(57) ABSTRACT

A display device of an embodiment includes scanning lines, signal lines, sub-pixels, a switching element in each of the sub-pixels, a pixel electrode in each of the sub-pixels. The switching element includes a relay electrode in contact with the pixel electrode, and a semiconductor layer in contact with the signal line in a first position, in contact with the relay electrode in a second position, and bending between the first position and the second position and crossing the scanning line. In at least one of the sub-pixels, a part of the scanning line extends between the relay electrode and the signal line which are connected to each other via the semiconductor layer.

11 Claims, 5 Drawing Sheets

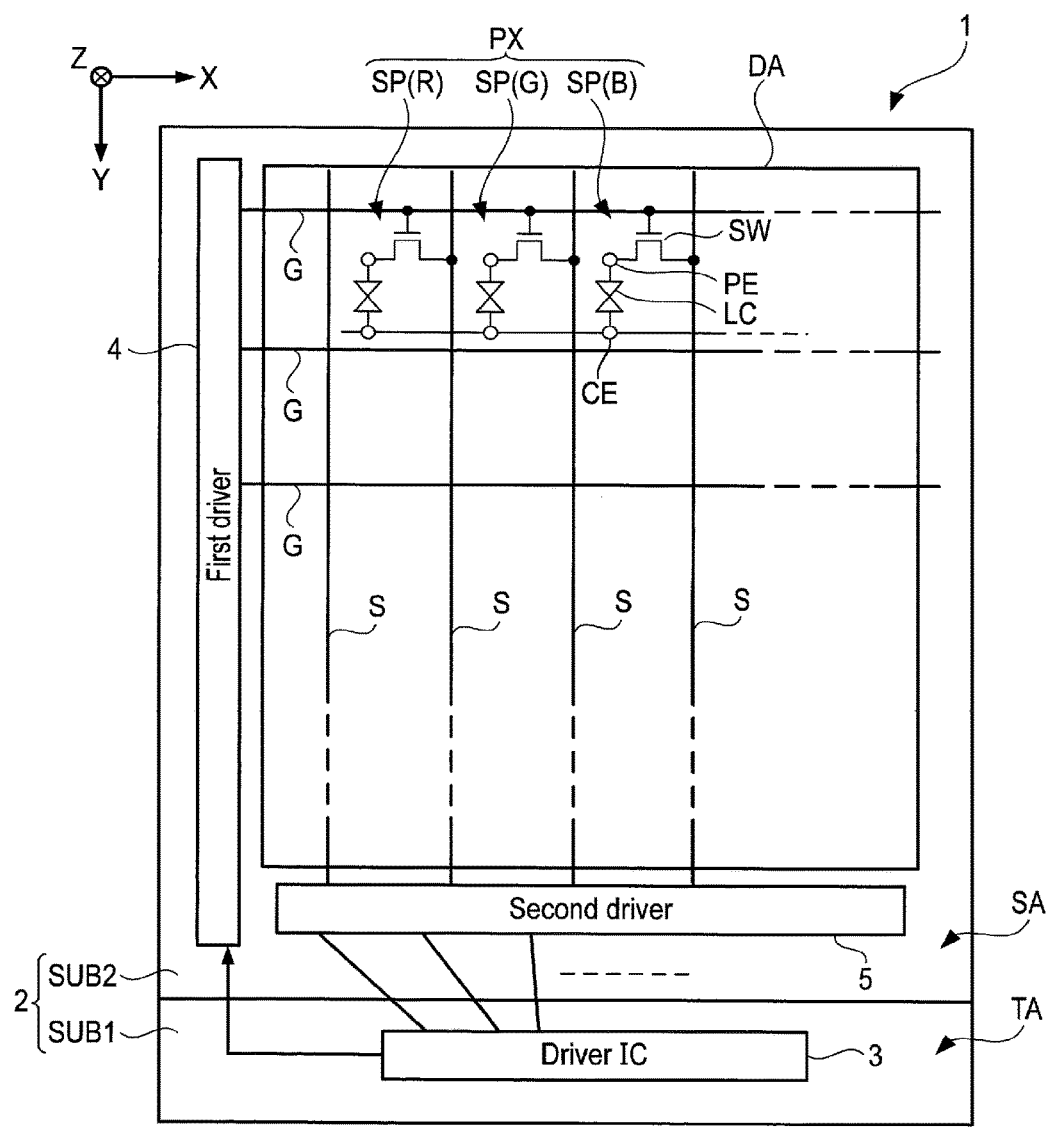
F I G. 1

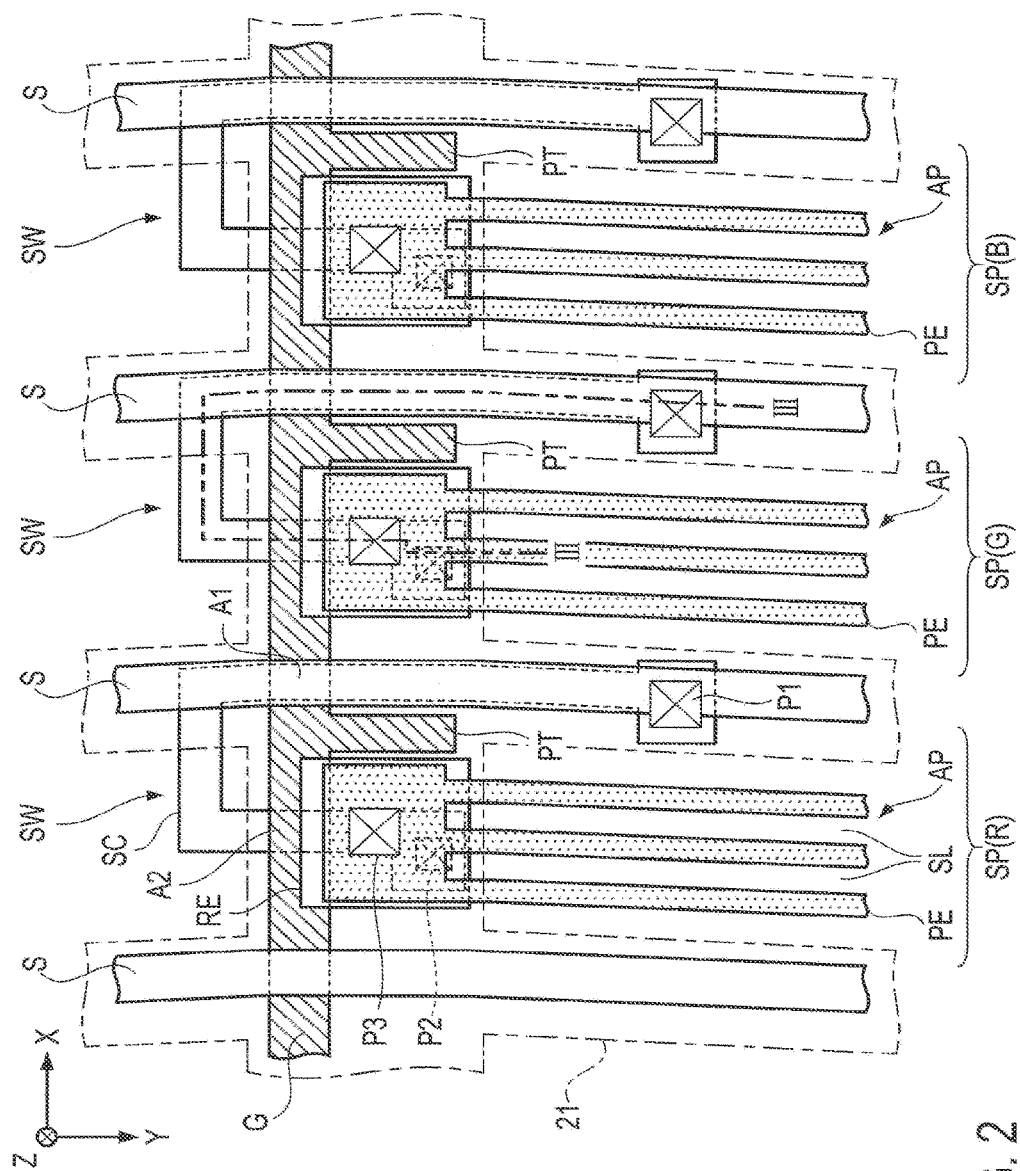
F I G. 2

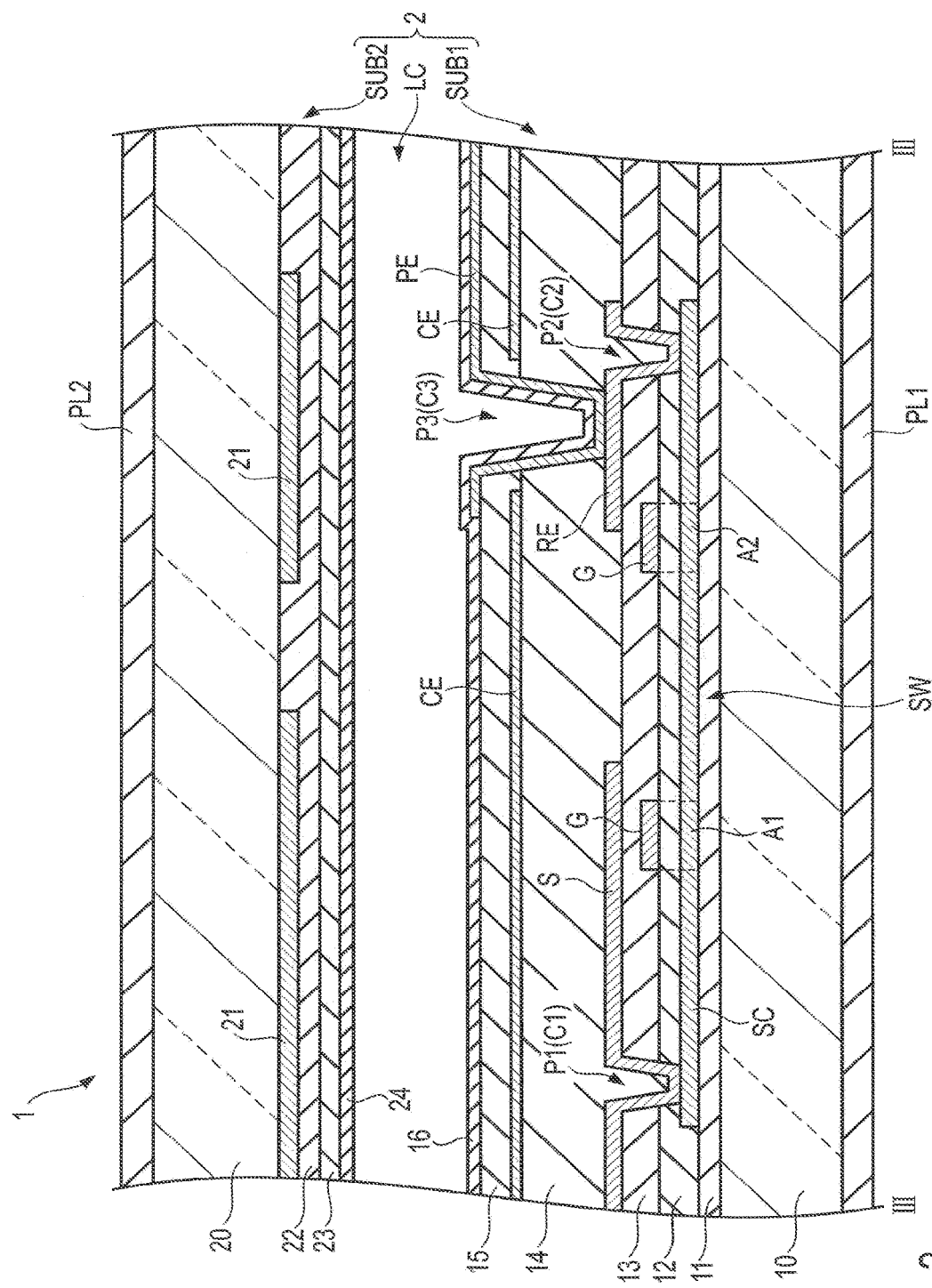
F I G. 3

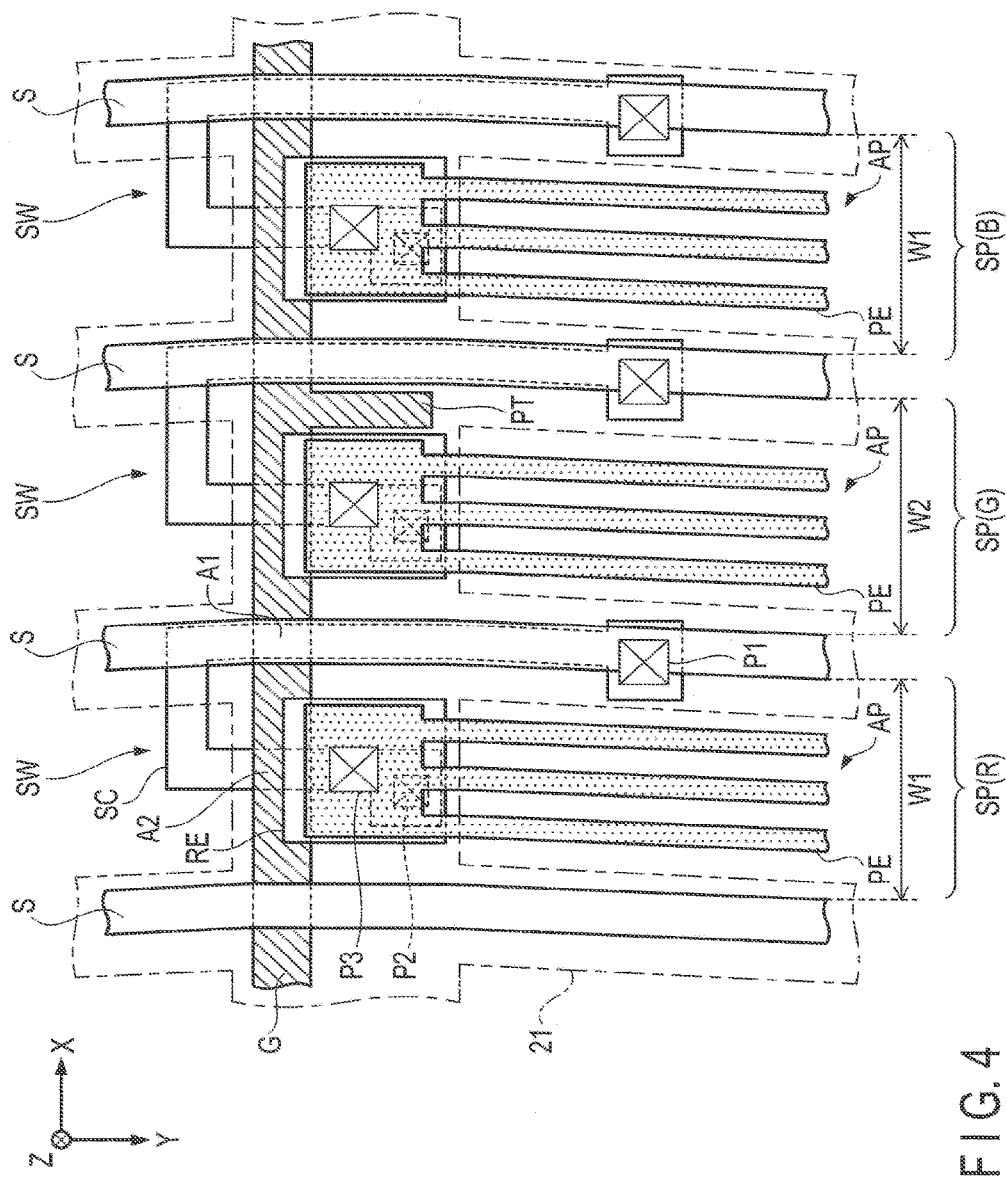
F I G. 4

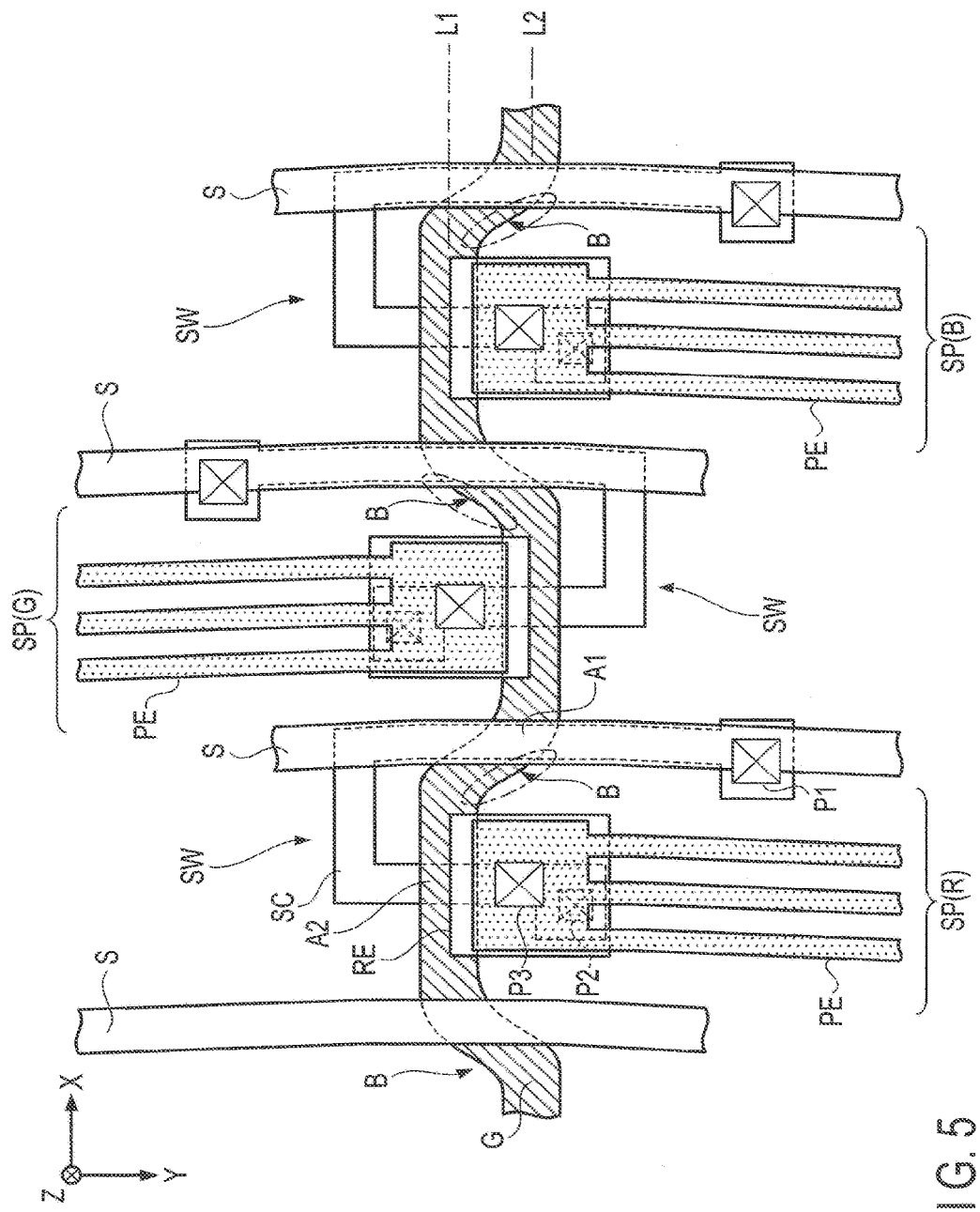
F I G. 5

DISPLAY DEVICE

CROSS-REFERENCE TO RELATED APPLICATIONS

This application is based upon and claims the benefit of priority from Japanese Patent Application No. 2016-109979, filed Jun. 1, 2016, the entire contents of which are incorporated herein by reference.

FIELD

Embodiments described herein relate generally to a display device.

BACKGROUND

A display device such as a liquid crystal display includes signal lines, pixel electrodes, and switching elements provided in the respective pixels. The switching element includes a semiconductor layer connected to the pixel electrode and the signal line. Further, a relay electrode is provided between the semiconductor layer and the pixel electrode, and for example, the relay electrode and the signal line are provided in the same layer as each other.

Recently, in display devices, progress has been made in image resolution. In the high-definition display device, since the pixel is so fine, it is difficult to secure high storage capacitance for the pixel electrode. Therefore, negative effects will be caused by the coupling between the signal line and the pixel electrode. Such coupling tends to occur between the above-described relay electrode and the signal line.

BRIEF DESCRIPTION OF THE DRAWINGS

FIG. 1 is a schematic plan view of the structure of a display device of a first embodiment.

FIG. 2 is a schematic plan view of sub-pixels included in one pixel.

FIG. 3 is a schematic sectional view of the display device taken along line III-III of FIG. 2.

FIG. 4 is a schematic plan view of sub-pixels of a second embodiment.

FIG. 5 is a schematic plan view of sub-pixels of a third embodiment.

DETAILED DESCRIPTION

In general, according to one embodiment, a display device includes: scanning lines; signal lines crossing the scanning lines; sub-pixels defined by the scanning lines and the signal lines; a switching element in each of the sub-pixels; and a pixel electrode in each of the sub-pixels. The switching element includes: a relay electrode in contact with the pixel electrode; and a semiconductor layer in contact with the signal line in a first position, in contact with the relay electrode in a second position, and bending between the first position and the second position and crossing the scanning line. In at least one of the sub-pixels, a part of the scanning line extends between the relay electrode and the signal line which are connected to each other via the semiconductor layer.

Embodiments will be described with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the respective parts are illustrated in the drawings schematically, rather than as an accurate representation of what is implemented. However, such schematic illustration is merely exemplary, and in no way restricts the interpretation of the invention. In the drawings, reference numbers of continuously arranged elements equivalent or similar to each other are omitted in some cases. In addition, in the specification and drawings, structural elements which function in the same or a similar manner to those described in connection with preceding drawings are denoted by like reference numbers, detailed description thereof being omitted unless necessary.

In each of the embodiments, as an example of a display device, a liquid crystal display device will be described. However, each of the embodiments does not preclude the application of individual technical ideas disclosed in the embodiment to various other display devices. Examples of these display devices are, for example, a self-luminous display device including an organic electroluminescent display element and an electronic-paper type display device including an electrophoresis element.

First Embodiment

FIG. 1 is a schematic plan view of the structure of a display device 1 of the first embodiment. The display device 1 includes a display panel 2 and a driver IC 3. The display panel 2 includes a first substrate SUB1 (array substrate), a second substrate SUB2 (counter-substrate), and a liquid crystal layer LC. In the example shown in FIG. 1, the size of the first substrate SUB1 is greater than the size of the second substrate SUB2. The first substrate SUB1 and the second substrate SUB2 are attached to each other such that three sides of one substrate are laid on three sides of the other substrate. The liquid crystal layer LC is sealed between the first substrate SUB1 and the second substrate SUB2.

In an area where the first substrate SUB1 and the second substrate SUB2 overlap each other, the display panel 2 includes a display area DA where pixels PX for image display are formed, and a surrounding area SA around the display area DA. Further, the display panel 2 includes a terminal area TA (unopposed area) where the first substrate SUB1 and the second substrate SUB2 do not overlap each other. In the example shown in FIG. 1, the driver IC 3 is mounted in the terminal area TA.

In the display area DA, the first substrate SUB1 includes scanning lines G which extend in a first direction X and are arranged in a second direction Y, and signal lines S which extend in the second direction Y and are arranged in the first direction X. Although the scanning line G and the signal line S are illustrated as straight lines in the example shown in FIG. 1, the scanning line G and the signal line S may also be winding or meandering lines. Hereinafter, the direction orthogonal to the first direction X and the second direction Y (the thickness direction of the display device 1) will be referred to as a third direction Z.

The first substrate SUB1 includes a first driver 4 (gate driver) connected to each of the scanning line G, and a second driver 5 (source driver) connected to each of the signal line S. In the example shown in FIG. 1, the first driver 4 is provided in the surrounding area SA and arranged along one side of the display area DA which extends in the second direction Y, and the second driver 5 is provided in the surrounding area SA and arranged between the display area DA and the terminal area TA. Note that the first driver 4 and the second driver 5 may be provided in the first substrate SUB1 in various other ways or may be provided outside the first substrate SUB1. Alternatively, a pair of first drivers 4 may be provided along both sides of the display area DA which extend in the second direction Y.

The pixels PX are arranged in a matrix in the first direction X and the second direction Y. The pixel PX includes several sub-pixels SP. For example, each sub-pixel SP corresponds to an area defined by two adjacent scanning lines G and two adjacent signal lines S.

In the example shown in FIG. 1, three sub-pixels SP are included in one pixel PX. These three sub-pixels SP display, for example, red (R), green (G) and blue (B), respectively. Note that the pixel PX may include more than three sub-pixels SP. Further, the colors of the sub-pixels SP in the pixel PX are not limited to red, green and blue and may include white, yellow and various other colors.

In each of the sub-pixels SP, the first substrate SUB1 includes the switching element SW and the pixel electrode PE. Further, a common electrode CE, which is commonly provided with respect to the sub-pixels SP, extends in each of the sub-pixels SP. The common electrode CE may be provided in either the first substrate SUB1 or the second substrate SUB2.

The driver IC 3 controls the first driver 4 and the second driver 5. The first driver 4 supplies a scanning signal to each of the scanning lines G. The second driver 5 supplies a video signal to each of the signal lines S. The second driver 5 may execute column inversion drive which inverses the polarity of the video signals supplied to the adjacent signal lines S.

When a scanning signal is supplied to the scanning line G corresponding to a certain switch element SW, a video signal to be supplied to the signal line S connected to this switching element SW is supplied to the pixel electrode PE connected to this switching element SW. At this time, an electric field is produced between the pixel electrode PE and the common electrode CE, and this electric field acts on the liquid crystal layer LC. According to these operations, the turn-on and turn-off of each of the sub-pixels SP can be controlled.

The display device 1 may be a transmissive display device which displays an image by using light from a backlight or may also be a reflective display device which displays an image by reflecting external light or light from a front light. Further, the display device 1 may have both the function of a transmissive display device and the function of a reflective display device.

FIG. 2 is a schematic plan view of three sub-pixels SP included in one pixel PX. In the example shown in the drawing, the scanning line G linearly extends in the first direction X. The signal line S windingly extends in the second direction Y. The scanning line G and the signal line S are formed of a metal material.

The switching element SW includes the semiconductor layer SC and a relay electrode RE. For example, the semiconductor layer SC is formed of low-temperature polycrystalline silicon (LIPS). Note that the semiconductor layer SC may be formed of various other materials. For example, the relay electrode RE and the signal line S are formed of the same metal material as each other and are provided in the same layer as each other.

The semiconductor layer SC is in contact with the signal line S in a first position P1 and in contact with the relay electrode RE in a second position P2. The semiconductor layer SC extends from the first position P1 toward the scanning line G such that the semiconductor layer SC overlaps the signal line S. After crossing the scanning line G, the semiconductor layer SC bends parallel to the first direction X. Subsequently, the semiconductor layer SC bends parallel to the second direction Y, crosses the scanning line G again, and arrives at the second position P2. That is, the semiconductor layer SC is U-shaped or J-shaped. Further, since the semiconductor layer SC crosses the scanning line G twice, the semiconductor layer SC has two gate regions A1 and A2 which are opposed to the scanning line G.

In the example shown in FIG. 2, the relay electrode RE is rectangular and partially overlaps the scanning line G. Note that the relay electrode RE is not necessarily rectangular or does not necessarily have to overlap the scanning line G. The relay electrode RE and the pixel electrode PE are in contact with each other in a third position P3.

For example, the pixel electrode PE is formed of indium tin oxide (ITO). Although not shown in FIG. 2, the above-described common electrode CE is opposed to the pixel electrode PE. The common electrode CE may also be formed of ITO.

In the example shown in FIG. 2, the pixel electrode PE has two slits which extend parallel to the signal line S. Note that the pixel electrode PE may have more than two slits SL or only one slit SL, or may not have any slit SL at all.

In the drawing, a region indicated by a dashed line corresponds to a light-shielding layer 21 functioning as a light shield. The light-shielding layer 21 is opposed to the signal line S, the scanning line G, the relay electrode RE, and the semiconductor layer SC. The light-shielding layer 21 includes an aperture AP in the sub-pixel SP. The pixel electrode PE extends in the aperture AP.

FIG. 3 is a schematic sectional view of the display device 1 taken along line III-III of FIG. 2. The first substrate SUB1 includes a first insulating substrate 10, a first insulating layer 11, a second insulating layer 12, a third insulating layer 13, a fourth insulating layer 14, a fifth insulating layer 15, a first alignment film 16, the scanning line G, the signal line S, the semiconductor layer SC, the relay electrode RE, the pixel electrode PE, and the common electrode CE.

For example, the first insulating substrate 10 is a transparent, glass substrate or resin substrate. The first insulating layer 11 covers the inner surface (the surface opposed to the second substrate SUB2) of the first insulating substrate 10. The semiconductor layer SC is formed on the first insulating layer 11. The second insulating layer 12 covers the first insulating layer 11 and the semiconductor layer SC. The scanning line G is formed on the second insulating layer 12. The third insulating layer 13 covers the second insulating layer 12 and the scanning line G.

The signal line S and the relay electrode RE are formed on the third insulating layer 13. The fourth insulating layer 14 covers the third insulating layer 13, the signal line S, and the relay electrode RE. The common electrode CE is formed on the fourth insulating layer 14. The fifth insulating layer 15 covers the fourth insulating layer 14 and the common electrode CE. The pixel electrode PE is formed on the fifth insulating layer 15. The first alignment film 16 covers the fifth insulating layer 15 and the pixel electrode PE.

In the first position P1, a first contact hole C1 which penetrates the second insulating layer 12 and the third insulating layer 13 is provided. Further, in the second position P2, a second contact hole C2 which penetrates the second insulating layer 12 and the third insulating layer 13 is provided. The signal line S is in contact with the semiconductor layer SC via the first contact hole C1. The relay electrode RE is in contact with the semiconductor layer SC via the second contact hole C2.

In the third position P3, a third contact hole C which penetrates the fourth insulating layer 14 and the fifth insulating layer 15 is provided. The pixel electrode PE is in contact with the relay electrode RE via the third contact hole C3.

The second substrate SUB2 includes a second insulating substrate 20, a color filter layer 22, an overcoat layer 23, a second alignment film 24, and the above-described light-shielding layer 21. For example, the second insulating substrate 20 is a transparent, glass substrate or resin substrate. The light-shielding layer 21 is formed on the inner surface (the surface opposed to the first substrate SUB1) of the second insulating substrate 20. The color filter layer 22 covers the light-shielding layer 21 and the inner surface of the second insulating substrate 20. The color filter layer 22 is colored according to the color of each of the sub-pixels SP. The overcoat layer 23 covers the color filter layer 22. The second alignment film 24 covers the overcoat layer 23.

The liquid crystal layer LC is arranged between the first alignment film 16 and the second alignment film 24. A first polarizer PL1 is provided on the outer surface of the first insulating substrate 10. A second polarizer PL2 is provided on the outer surface of the second insulating substrate 20. In these polarizers PL1 and PL2, polarization axes thereof are orthogonal to each other.

The structure shown in FIG. 3 is applicable to in-plane switching (IPS) modes where the pixel electrode PE and the common electrode CE are provided in the first substrate SUB1, in particular, a fringe field switching (FFS) mode. Note that the structure of the display device 1 is not limited to this structure. For example, the common electrode CE may be provided in the second substrate SUB2. Alternatively, the common electrode CE may be provided in the first substrate SUB1, and the common electrode CE may be closer to the liquid crystal layer LC than the pixel electrode PE.

Now, the embodiment will be described with reference to FIG. 2 again. In the present embodiment, the scanning line G in each of the sub-pixels SP partially extends between the relay electrode RE and the signal line S which are connected to each other via the semiconductor SC. More specifically, the scanning line G has a projection PT in each of the sub-pixels SP, and the projection PT extends between the signal line S and the relay electrode RE.

In the example show FIG. 2, the width of the projection PT in the first direction X (the extension direction of the scanning line G) is less than the width of the scanning line G in the second direction Y (the extension direction of the signal line S) and the width of the signal line S in the first direction X. Further, the length of the projection PT in the second direction Y is less than the length of the relay electrode RE in the second direction Y. Note that, the length of the projection PT in the second direction Y may be greater than or equal to the length of the relay electrode RE in the second direction Y. In the second direction Y, the distal end of the projection PT is located between the first position P1 and the third position P3. Note that the shape of the projection PT has been exemplarily described and various other shapes may also be adopted as the shape of the projection PT.

The projection PT is not opposed to any of the semiconductor layer SC, the relay electrode RE, the signal line S, and the pixel electrode PE. Further, in the first direction X, the projection PT is located between the first position P1 and the second position P2. In other words, the projection PT is arranged such that the projection PT is interposed between two facing parts of the winding semiconductor SC.

Now, negative effects to be caused in the absence of the projection PT will be described.

Between the signal line S and the relay electrode RE, parasitic capacitance is produced. In the structure of the switching element SW shown in FIGS. 2 and 3, since the signal line S and the relay electrode RE are formed in the same layer as each other, the above-described parasitic capacitance tends to increase. Further, when the pixel PX is so fine as to achieve a resolution higher than 500 ppi, sufficient space cannot be provided between the relay electrode RE and the signal line S, and the storage capacitance between the pixel electrode PE and the common electrode CE will decrease, accordingly, and consequently the parasitic capacitance will relatively increase further. As the parasitic capacitance increases, the signal line S and the pixel electrode PE are coupled with each other, and the coupling causes undesirable change in the potential of the pixel electrode PE.

Such change in the potential will be visually recognized as flicker of the display image. For example, when the above-described column inversion drive is adopted, in the white raster display where all the sub-pixels are simultaneously turned on, since the adjacent signal lines S have different polarity, the influences of these signal lines S are canceled out. However, for example, in the single-color raster display where only one of the sub-pixels SP is turned on, since the cancel effect will not be produced, flicker will occur notably.

Further, in light of reduction in the power consumption, the drive frequency of the display device 1 has been reduced to such a low level as 30 Hz or 15 Hz recently. Although the flicker is not easily visible by the viewer in the high-frequency drive, the flicker will be visible by the viewer in the low-frequency drive.

To solve these problems, in the present embodiment, a part of the scanning line G, that is, the projection PT is extended between the relay electrode RE and the signal line S. The projection PT functions as a shield to prevent the signal line S from being coupled with the relay electrode RE and the pixel electrode PE. Therefore, undesirable change in the potential of the pixel electrode PE can be suppressed. As a result, flicker can be suppressed, and the display quality of the display device 1 can be enhanced.

Since flicker is suppressed, for example, even when the display device 1 includes such a fine pixel PX as to achieve a resolution higher than 500 ppi or even when the display device 1 executes low-frequency drive, the display device 1 can still achieve excellent display quality.

In addition to those described above, various other advantages can be achieved from the present embodiment.

Second Embodiment

The second embodiment will be described. Unless otherwise specified, the structure of the present embodiment is the same as the structure of the first embodiment.

FIG. 4 is a schematic plan view of the sub-pixels SP included in one pixel PX in the display device 1 of the present embodiment. The example shown in FIG. 4 is different from the example shown in FIG. 2 in that the projection PT is provided only in the green (G) sub-pixel SP.

Among red, green and blue, the most luminous color to the viewer is green. Therefore, the above-described flicker will be most notable in the green (G) sub-pixel SP. In the present embodiment, even when the projection PT is provided only in the sub-pixel SP corresponding to the most luminous color, it is still possible to suppress the flicker visible to the viewer and enhance the display quality.

In the structure shown in FIG. 4, the distance between the relay electrode RE and the signal line S connected to this relay electrode RE via the semiconductor SC in the red (R) sub-pixel SP and the blue (B) sub-pixel SP can be set to be less than the corresponding distance in the green (G) sub-pixel SP. In this way, the red sub-pixel SP and the blue sub-pixel SP can be reduced in size.

For example, a first width W1 of each of the red sub-pixel SP and the blue sub-pixel SP in the first direction X (the extension direction of the scanning line G) is less than a second width W2 of the green sub-pixel SP in the first direction X. For example, the first width W1 and the second width W2 correspond to the distance between the adjacent signal lines S. Note that, in the sub-pixels SP of the respective colors, the apertures AP have the same size (aperture ratio) as each other. The size of the aperture AP is adjustable according to the shape of the light-shielding layer 21.

Although the projection PT is provided only in the green sub-pixel SP in the present embodiment, the projection PT may be provided further in either one of the red sub-pixel SP and the blue sub-pixel SP in addition to the green sub-pixel SP. That is, according to the luminosity or the like, the projections PT can be provided in not all but some of the sub-pixels SP constituting one pixel PX.

Third Embodiment

The third embodiment will be described. Unless otherwise specified, the structure of the present embodiment is the same as the structures of the above-described embodiments.

FIG. 5 is a schematic plan view of the sub-pixels SP included in one pixel PX in the display device 1 of the present embodiment. In all the sub-pixels SP, the scanning line G does not have the above-described projection PT. Meanwhile, in the example shown in FIG. 5, the scanning line G windingly extends in the first direction X.

More specifically, the scanning signal line G in the red (R) sub-pixel SP and the blue (B) sub-pixel SP extends along a first line L1 as indicated on the right side of the drawing, while the scanning signal line G in the green (G) sub-pixel SP extends along a second line L2 as indicated on the right side of the drawing. Each of the lines L1 and L2 are parallel to the first direction X. The scanning line G includes a bent portion B between a first portion extending along the first line L1 and a second portion extending along the second line L2. In the example shown in FIG. 4, the bent portion B is gently curved between the lines L1 and L2. Further, the bent portion B obliquely crosses the signal line S and the semiconductor layer SC in planar view.

For example, the width of the bent portion B is the same as the widths of the other portions along the lines L1 and L2. However, the width of the bent portion B may be different from the widths of the other portions along the lines L1 and L2. In the structure shown in FIG. 5, the scanning line G (the bent portion B) crosses the semiconductor layer SC at an angle other than a right angle. Therefore, when the width of the bent portion B is the same as the widths of the scanning lines G shown in FIGS. 2 and 4, the area of the gate region A will increase. In light of this, it is possible to adjust the area of the gate region A1 by setting the width of the bent portion B to be less than the widths of the other portions along the lines L1 and L2.

In each of the red sub-pixel SP and the blue sub-pixel SP, the first position P1, the second position P2, the relay electrode RE, and the pixel electrode PE are located on the lower side of the drawing with respect to the scanning line G. On the other hand, in the green sub-pixel SP, the first position P1, the second position P2, the relay electrode RE, and the pixel electrode PE are located on the upper side of the drawing with respect to the scanning line G. That is, the red and blue sub-pixels SP and the green sub-pixel SP are symmetrical with respect to an axis in the first direction X.

In each of the sub-pixels SP, as circled with a dashed line, a part of the bent portion B extends between the signal line S and the relay electrode RE connected to this signal line S via the semiconductor layer SC. In the same manner as that of the above-described projection PT, this part of the bent portion B suppresses the coupling between the signal line S and the relay electrode RE. Therefore, the same advantages as those of the above-described embodiments can be achieved from the structure shown in FIG. 5.

Note that the above-described structures of the first to third embodiments can be appropriately combined with each other.

For example, the projections PT shown in FIGS. 2 and 4 may also be provided in the structure shown in FIG. 5.

Further, in each of the embodiments, a part of the scanning line G extends between the relay electrode RE provided between two adjacent signal lines S and one of these two signal lines S. However, the scanning line G may also extend between the relay electrode RE and the other of these two signal lines S. That is, in FIGS. 2 and 4, one projection PT may be provided between the relay electrode RE and one of the signal lines S, and another projection PT may be provided between the relay electrode RE and the other of the signal lines S. Further, in the example shown in FIG. 5, a part of one bent portion B may extend between the relay electrode RE and one of the signal lines S, and a part of another bent portion B may extend between the relay electrode RE and the other of the signal lines S.

Still further, all display devices implementable by a person having ordinary skill in the art through appropriate design change to the display devices described as the embodiments of the present invention will come within the scope of the present invention as long as they fall within the scope and spirit of the present invention.

Still further, it is natural for a person having ordinary skill in the art to conceive of various modifications of the present invention within the scope of the technical concept of the present invention, and such modifications will be encompassed by the scope and spirit of the present invention. For example, the above-described embodiments with appropriate addition, deletion and/or design change of the structural elements, or appropriate addition, omission and/or condition change of the manufacturing process by a person having ordinary skill in the art will also come with in the scope of the present invention as long as they fall within the scope and spirit of the present invention.

Still further, in addition to the advantages described above in the embodiments, advantages obvious from the description of the present invention and advantages appropriately conceivable by a person having ordinary skill in the art will be regarded as the advantages achievable from the present invention as a matter of course.

What is claimed is:
1. A display device comprising:
   scanning lines;
   signal lines crossing the scanning lines;
   sub-pixels defined by the scanning lines and the signal lines;
   a switching element in each of the sub-pixels;

a pixel electrode in each of the sub-pixels, wherein
the switching element includes:
    a relay electrode in contact with the pixel electrode; and
    a semiconductor layer in contact with the signal line in a first position, in contact with the relay electrode in a second position, and bending between the first position and the second position and crossing the scanning line, and
in at least one of the sub-pixels, a part of the scanning line extends between the relay electrode and the signal line which are connected to each other via the semiconductor layer, wherein
the scanning line includes a projection in at least one of the sub-pixels, and
the projection extends between the relay electrode and the signal line which are connected to each other via the semiconductor layer.

2. The display device of claim 1, wherein
the scanning line has the projection in one of the sub-pixel which displays the most luminous color.

3. The display device of claim 1, wherein in an extension direction of the signal line, a length of the projection is less than a length of the relay electrode.

4. The display device of claim 1, wherein in an extension direction of the scanning line, the projection is located between the first position and the second position.

5. The display device of claim 1, wherein
the relay electrode is in contact with the pixel electrode in a third position, and
in an extension direction of the signal line, a distal end of the projection is located between the first position and the third position.

6. The display device of claim 1, wherein
in an extension direction of the scanning line, a first width of the sub-pixel without the projection is less than a second width of the sub-pixel with the projection.

7. The display device of claim 6, further comprising a light-shielding layer opposed to the scanning line and the signal line, wherein
the light-shielding layer includes apertures respectively in the sub-pixels,
the aperture of the sub-pixel with the projection and the aperture of the sub-pixel without the projection have the same size as each other.

8. A display device comprising:
scanning lines;
signal lines crossing the scanning lines;
sub-pixels defined by the scanning lines and the signal lines;
a switching element in each of the sub-pixels;
a pixel electrode in each of the sub-pixels, wherein
the switching element includes:
    a relay electrode in contact with the pixel electrode; and
    a semiconductor layer in contact with the signal line in a first position, in contact with the relay electrode in a second position, and bending between the first position and the second position and crossing the scanning line, and
in at least one of the sub-pixels, a part of the scanning line extends between the relay electrode and the signal line which are connected to each other via the semiconductor layer, wherein
the scanning line includes a bent portion in at least one of the sub-pixels, and
the bent portion extends between the relay electrode and the signal line which are connected to each other via the semiconductor layer.

9. The display device of claim 8, wherein the bent portion crosses the signal line.

10. The display device of claim 8, wherein the bent portion obliquely crosses the signal line.

11. The display device of claim 8, wherein the scanning line includes a first portion extending along a first line, a second portion extending along a second line, and the bent portion between the first portion and the second portion.

* * * * *